US010505075B2

(12) United States Patent
Obata et al.

(10) Patent No.: US 10,505,075 B2
(45) Date of Patent: Dec. 10, 2019

(54) SEMICONDUCTOR LIGHT EMITTING DEVICE

(71) Applicant: ALPAD CORPORATION, Chiyoda-ku (JP)

(72) Inventors: Susumu Obata, Nonoici (JP); Akihiro Kojima, Nonoici (JP)

(73) Assignee: ALPAD CORPORATION, Chiyoda-ku (JP)

( * ) Notice: Subject to any disclaimer, the term of this patent is extended or adjusted under 35 U.S.C. 154(b) by 0 days.

(21) Appl. No.: 15/918,753

(22) Filed: Mar. 12, 2018

(65) Prior Publication Data
US 2018/0204980 A1    Jul. 19, 2018

Related U.S. Application Data

(60) Continuation of application No. 15/597,226, filed on May 17, 2017, now Pat. No. 9,960,320, which is a (Continued)

(30) Foreign Application Priority Data
Mar. 16, 2015    (JP) .................. 2015-052160

(51) Int. Cl.
*H01L 33/38*    (2010.01)
*H01L 33/36*    (2010.01)
(Continued)

(52) U.S. Cl.
CPC .............. *H01L 33/38* (2013.01); *H01L 33/36* (2013.01); *H01L 33/385* (2013.01); *H01L 33/40* (2013.01);
(Continued)

(58) Field of Classification Search
CPC combination set(s) only.
See application file for complete search history.

(56) References Cited

U.S. PATENT DOCUMENTS 6,555,209 B1    4/2003 Yoshimura
8,399,275 B2    3/2013 Akimoto
(Continued)

FOREIGN PATENT DOCUMENTS

CN    101673797 A    3/2010
CN    102800775 A    11/2012
(Continued)

*Primary Examiner* — Fazli Erdem
(74) *Attorney, Agent, or Firm* — Oblon, McClelland, Maier & Neustadt, L.L.P.

(57) ABSTRACT

According to one embodiment, a semiconductor light emitting device includes a semiconductor layer, a first metal pillar, a second metal pillar, and an insulating layer. The semiconductor layer includes a first surface, a second surface, and a light emitting layer. The first metal pillar is electrically connected to the second surface. The first metal pillar includes first and second metal layers. The first metal layer is provided between the second surface and at least a part of the second metal layer. The second metal pillar is arranged side by side with the first metal pillar, and electrically connected to the second surface. The second metal pillar includes third and fourth metal layers. The third metal layer is provided between the second surface and at least a part of the fourth metal layer. The insulating layer is provided between the first and second metal pillars.

18 Claims, 12 Drawing Sheets

Related U.S. Application Data division of application No. 14/842,162, filed on Sep. 1, 2015, now Pat. No. 9,705,039.

(51) Int. Cl.
*H01L 33/40* (2010.01)
*H01L 33/00* (2010.01)
*H01L 33/20* (2010.01)
*H01L 33/50* (2010.01)

(52) U.S. Cl.
CPC .......... *H01L 33/0079* (2013.01); *H01L 33/20* (2013.01); *H01L 33/505* (2013.01); *H01L 2933/005* (2013.01); *H01L 2933/0016* (2013.01); *H01L 2933/0066* (2013.01)

(56) References Cited

U.S. PATENT DOCUMENTS

| | | | |
|---|---|---|---|
| 8,436,379 B2 | 5/2013 | Hirao et al. | |
| 8,754,429 B2 | 6/2014 | Koizumi | |
| 8,759,863 B2 | 6/2014 | Sugizaki | |
| 8,981,412 B2 | 3/2015 | Koizumi | |
| 9,172,016 B2 | 10/2015 | Tomizawa | |
| 9,269,878 B2 | 2/2016 | Hwang | |
| 9,397,261 B2 | 7/2016 | Kang | |
| 2005/0161771 A1 | 7/2005 | Suehiro | |
| 2006/0261364 A1 | 11/2006 | Suehiro | |
| 2007/0096318 A1 | 5/2007 | Kawashiro | |
| 2007/0116864 A1 | 5/2007 | Chen | |
| 2009/0159902 A1 | 6/2009 | Yasuda | |
| 2010/0140640 A1 | 6/2010 | Shimokawa | |
| 2011/0031519 A1 | 2/2011 | Hiroa | |
| 2011/0037051 A1 | 2/2011 | Lin et al. | |
| 2011/0073889 A1 | 3/2011 | Sugizaki et al. | |
| 2011/0284909 A1 | 11/2011 | Sugizaki | |
| 2011/0291148 A1 | 12/2011 | Sugizaki et al. | |
| 2011/0297987 A1 | 12/2011 | Koizumi | |
| 2011/0300644 A1 | 12/2011 | Akimoto | |
| 2012/0241792 A1* | 9/2012 | Obata | H01L 33/62 257/98 |
| 2012/0299038 A1 | 11/2012 | Hwang | |
| 2013/0119424 A1 | 5/2013 | Kang | |
| 2013/0193464 A1 | 8/2013 | Bae | |
| 2014/0008688 A1 | 1/2014 | Shimokawa | |
| 2014/0042450 A1 | 2/2014 | Akiyama et al. | |
| 2014/0151739 A1 | 6/2014 | Koizumi | |
| 2014/0217438 A1 | 8/2014 | Tomizawa et al. | |
| 2015/0034985 A1 | 2/2015 | Tomizawa | |
| 2015/0076546 A1* | 3/2015 | Obata | H01L 33/405 257/98 |
| 2015/0091042 A1 | 4/2015 | Kim | |
| 2015/0179884 A1 | 6/2015 | Kang | |
| 2015/0243853 A1 | 8/2015 | Cha | |

FOREIGN PATENT DOCUMENTS

| | | |
|---|---|---|
| JP | 2007-123577 A | 5/2007 |
| JP | 4756110 | 8/2011 |
| JP | 2011-249426 A | 12/2011 |
| JP | 2011-249502 A | 12/2011 |
| JP | 2013-65621 A | 4/2013 |
| JP | 2013-84989 | 5/2013 |
| JP | 2013-115336 | 6/2013 |
| JP | 2014-36162 | 2/2014 |
| JP | 2014-38886 A | 2/2014 |
| JP | 2014-150196 A | 8/2014 |
| JP | 2014-160870 | 9/2014 |
| TW | 201143169 A | 12/2011 |
| TW | 201415671 A | 4/2014 |

\* cited by examiner

SEMICONDUCTOR LIGHT EMITTING DEVICE

CROSS-REFERENCE TO RELATED APPLICATIONS

This application is a continuation of U.S. Ser. No. 15/597,226, filed on May 17, 2015, which is a division of and claims the benefit of priority under 35 U.S.C. § 120 from U.S. Ser. No. 14/842,162 filed Sep. 1, 2015, and claims the benefit of priority under 35 U.S.C. § 119 from Japanese Patent Application No. 2015-052160 filed Mar. 16, 2015; the entire contents of each of which are incorporated herein by reference.

FIELD

Embodiments described herein relate generally to a semiconductor light emitting device.

BACKGROUND

Some semiconductor light emitting devices have a chip size package structure. The semiconductor light emitting devices radiate visible light such as white light or light in other wavelength bands using light emitting diodes (LED) and phosphors in combination with each other. In such semiconductor light emitting devices, there is desired an improvement in productivity.

DETAILED DESCRIPTION

Figure 1A:
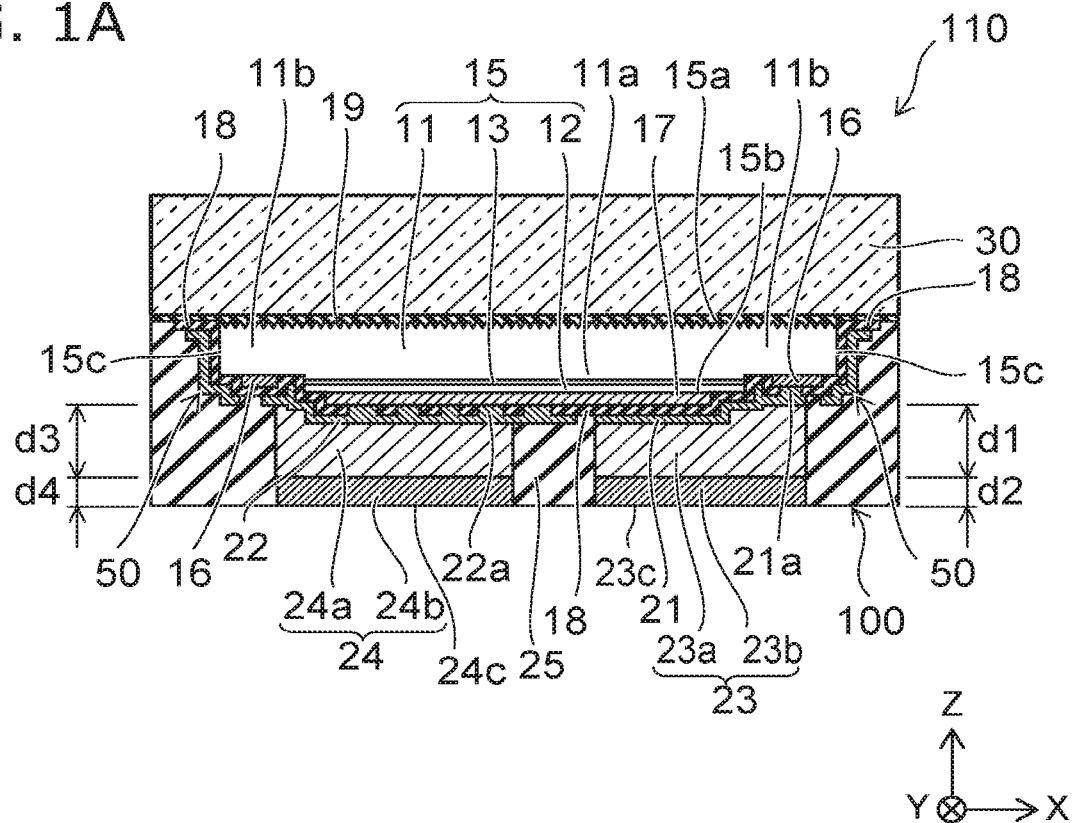
FIG. 1A and FIG. 1B are schematic diagrams illustrating an example of a semiconductor light emitting device according to a first embodiment.

According to one embodiment, a semiconductor light emitting device includes a semiconductor section, a first metal pillar, a second metal pillar, and an insulating layer. The semiconductor section includes a first surface, a second surface on an opposite side to the first surface, and a light emitting layer. The second surface is apart from the first surface in a first direction. The second surface includes a first region and a second region. The first region overlaps the light emitting layer in the first direction. The second region does not overlap the light emitting layer in the first direction. The first metal pillar is electrically connected with the second region. The first metal pillar includes a first metal layer and a second metal layer. A hardness of the second metal layer is higher than a hardness of the first metal layer. The first metal layer is provided between the second surface and at least a part of the second metal layer. The second metal pillar is arranged with the first metal pillar in a second direction intersecting the first direction. The second metal pillar is electrically connected with the first region. The second metal pillar includes a third metal layer and a fourth metal layer. A hardness of the fourth metal layer is higher than a hardness of the third metal layer. The third metal layer is provided between the second surface and at least a part of the fourth metal layer. The insulating layer is provided between the first metal pillar and the second metal pillar.

According to another embodiment, a semiconductor light emitting device includes a semiconductor section, a first metal pillar, a second metal pillar, and an insulating layer. The semiconductor section includes a first surface, a second surface on an opposite side to the first surface, and a light emitting layer. The second surface is apart from the first surface in a first direction. The second surface includes a first region and a second region. The first region overlaps the light emitting layer in the first direction. The second region does not overlap the light emitting layer in the first direction. The first metal pillar is electrically connected with the second region. The first metal pillar includes a first metal layer and a second metal layer. The first metal layer includes a first side surface parallel to the first direction. A hardness of the second metal layer is higher than a hardness of the first metal layer. The second metal pillar is arranged with the first metal pillar in a second direction intersecting the first direction. The second metal pillar is electrically connected with the first region. The second metal pillar includes a third metal layer and a fourth metal layer. The third metal layer includes a second side surface parallel to the first direction. A hardness of the fourth metal layer is higher than a hardness of the third metal layer. The insulating layer is provided between the first metal pillar and the second metal pillar. The second metal layer is provided between the first side surface and the insulating layer. The fourth metal layer is provided between the second side surface and the insulating layer.

Various embodiments will be described hereinafter with reference to the accompanying drawings.

It should be noted that the drawings are schematic or conceptual ones, and the relationship between the thickness and the width of each constituent, the dimensional ratio between the constituents, and so on are not necessarily the same as real ones. Further, even in the case of expressing the same constituents, the dimensions and the ratio between the constituents are differently expressed by drawing in some cases. It should be noted that in the specification and the drawings of the patent application, substantially the same constituents as those having already been described with respect to drawings having already been mentioned will be denoted with the same reference symbols, and the detailed explanation thereof will arbitrarily be omitted.

(First Embodiment)

Figure 1B:
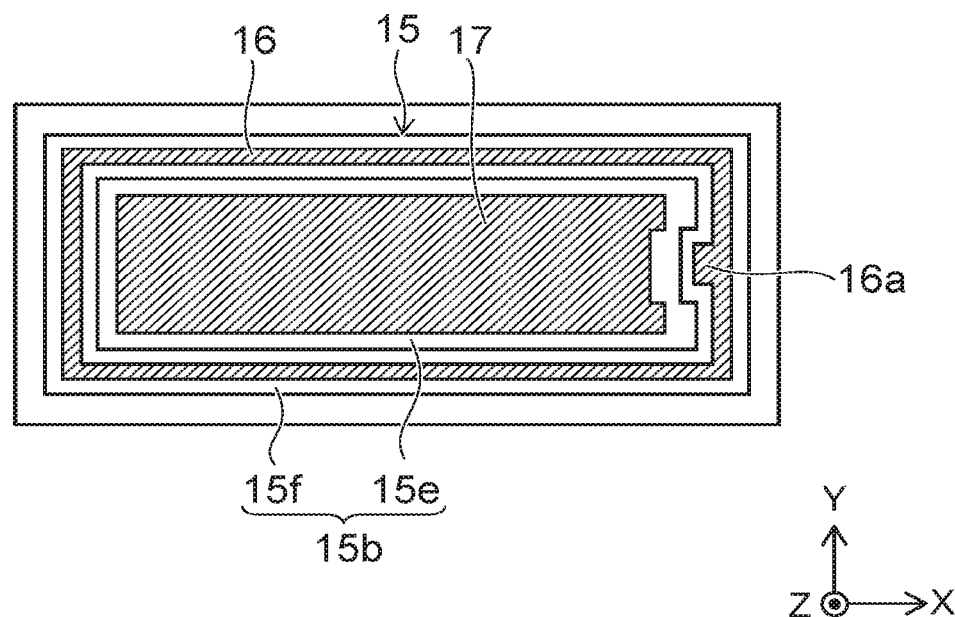

FIG. 1A and FIG. 1B are schematic diagrams illustrating a semiconductor light emitting device according to a first embodiment.

FIG. 1A is a schematic cross-sectional view illustrating the semiconductor light emitting device.

FIG. 1B is a schematic plan view illustrating the semiconductor light emitting device.

As shown in FIG. 1A and FIG. 1B, the semiconductor light emitting device 110 includes a semiconductor section 15. The semiconductor section 15 includes a first semiconductor layer 11 having a first conductivity type, a second semiconductor layer 12 having a second conductivity type, and a light emitting layer 13. For example, the first conductivity type is an n type. The second conductivity type is a p type. It is also possible to assume that the first conductivity type is the p type, and the second conductivity type is the n type. In the following description, there is explained the case in which the first conductivity type is the n type, and the second conductivity type is the p type.

The first semiconductor layer 11 includes, for example, a foundation buffer layer, and an n-type GaN layer. The second semiconductor layer 12 includes, for example, a p-type GaN layer. The light emitting layer 13 is provided between a part 11a of the first semiconductor layer 11 and the second semiconductor layers 12. The light emitting layer 13 includes a material for emitting blue light, violet light, bluish-violet light, ultraviolet light, or the like. The emission peak wavelength of the light emitting layer 13 is, for example, in a range not less than 430 nanometers (nm) and not more than 470 nm.

The semiconductor light emitting device 110 includes a first electrode 16, a second electrode 17, an interlayer insulating layer 18, a first wiring layer 21, a second wiring layer 22, a first metal pillar 23, a second metal pillar 24, an insulating layer 25, and a phosphor layer 30.

The first electrode 16 is electrically connected to the other part 11b of the first semiconductor layer 11. The first electrode 16 has contact with, for example, the other part 11b of the first semiconductor layer 11. The first electrode 16 is an n-electrode. The second electrode 17 is electrically connected to the second semiconductor layer 12. The second electrode 17 has contact with, for example, the second semiconductor layer 12. The second electrode 17 is a p-electrode. It should be noted that the state of being electrically connected includes the state in which another conductive member intervenes there between in addition to the state of having direct contact with each other.

The semiconductor section 15 includes a first surface 15a, and a second surface 15b located on the opposite side to the first surface 15a. In this example, the first surface 15a forms an upper surface of the semiconductor section 15, and the second surface 15b forms a lower surface of the semiconductor section 15. The second surface 15b of the semiconductor section 15 includes a first region 15e overlapping the light emitting layer 13 in a Z-axis direction, and a second region 15f not overlapping the light emitting layer 13 in the Z-axis direction. The first region 15e is a region of the semiconductor section 15 on which the light emitting layer 13 is stacked. The first region 15e is a light emitting region. The second region 15f is a region of the semiconductor section 15 on which the light emitting layer 13 is not stacked.

The first electrode 16 overlaps the second region 15f in the Z-axis direction. The second electrode 17 overlaps the first region 15e in the Z-axis direction. It should be noted that the term "overlap" denotes the state in which one thing at least partially overlaps another thing when projecting these things on a plane perpendicular to the Z-axis direction. In this example, the second region 15f surrounds the first region 15e, and the first electrode 16 surrounds the second electrode 17. It should be noted that the arrangement of the first electrode 16 and the second electrode 17 is not limited to this example.

The light emitting layer 13 is supplied with a current through the first electrode 16 and the second electrode 17, and then emits light. Then, the light radiated from the light emitting layer 13 is emitted from the first surface 15a side toward the outside of the semiconductor light emitting device 110.

On the first surface 15a, there is provided the phosphor layer 30 for providing a desired optical characteristic to the light emitted from the semiconductor light emitting device 110. The phosphor layer 30 includes a plurality of phosphor particles. The plurality of phosphor particles 31 is excited by the light radiated from the light emitting layer 13, and radiates light different in wavelength from the radiation light. The plurality of phosphor particles is integrated by a bonding material. The bonding material transmits the light radiated from the light emitting layer 13. The term "transmit" includes the case of partially absorbing the light.

Below the second surface 15b, there is provided a support member 100. The support member 100 supports the light emitting element including the semiconductor section 15, the first electrode 16, and the second electrode 17.

Below the semiconductor section 15, the first electrode 16, and the second electrode 17, there is provided the interlayer insulating layer 18. The interlayer insulating layer 18 protects the semiconductor section 15, the first electrode 16, and the second electrode 17. As the interlayer insulating layer 18, there is used an inorganic insulating film such as a silicon oxide film.

The interlayer insulating layer 18 is also provided on a side surface of the light emitting layer 13 and a side surface of the second semiconductor layer 12 to protect these side surfaces. The interlayer insulating layer 18 is also provided on a side surface 15c continuous from the first surface 15a to protect the side surface 15c, namely the side surface of the first semiconductor layer 11.

To the interlayer insulating layer 18, there are provided a via hole 21a and a plurality of via holes 22a. The first wiring layer 21 is electrically connected to the first electrode 16 via the via hole 21a. The second wiring layer 22 is electrically connected to the second electrode 17 via the plurality of via holes 22a. The first metal pillar 23 is electrically connected to the first electrode 16 via the first wiring layer 21. The second metal pillar 24 is electrically connected to the second electrode 17 via the second wiring layer 22.

Figure 2:
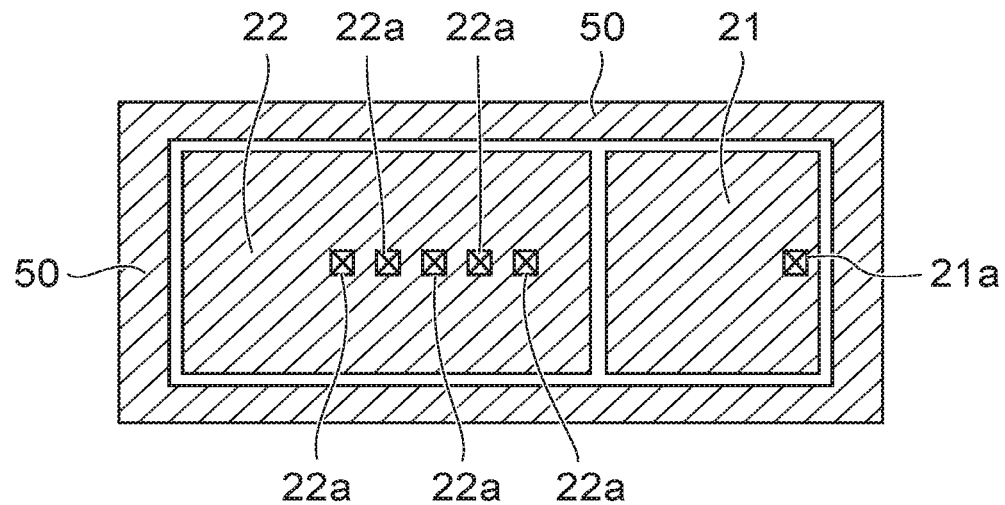
FIG. 2 is a schematic plan view illustrating a planar layout of the semiconductor light emitting device.

FIG. 2 is a schematic plan view illustrating a planar layout of the semiconductor light emitting device.

The first wiring layer 21 and the second wiring layer 22 extend below the interlayer insulating layer 18 so as to overlap the second surface 15*b*. Here, as shown in FIG. 1B, the first electrode 16 is provided with an electrode portion having a thin line shape, and a pad portion 16*a* having an enlarged width. The first wiring layer 21 is connected to the first electrode 16 via the via hole 21*a* reaching the pad portion 16*a*.

Below the interlayer insulating layer 18 for protecting the side surface 15*c* of the semiconductor section 15, there is provided a reflecting layer 50. The reflecting layer 50 has a reflective property with respect to the light radiated from the light emitting layer 13 and the light radiated from the phosphor layer 30.

Between the first surface 15*a* of the semiconductor section 15 and the phosphor 30, there is provided an interlayer insulating layer 19. By providing the interlayer insulating layer 19, it is possible to improve the adhesiveness between the semiconductor section 15 and the phosphor 30. As the interlayer insulating layer 19, it is possible to use either of a silicon oxide film and a silicon nitride film.

Between the first wiring layer 21 and the second wiring layer 22, there is provided an insulating layer 25. The insulating layer 25 is a resin layer including a pigment component such as black carbon. The insulating layer 25 is provided between the first metal pillar 23 and the second metal pillar 24 so as to have contact with a side surface of the first metal pillar 23 and a side surface of the second metal pillar 24. In other words, the space between the first metal pillar 23 and the second metal pillar 24 is filled with the insulating layer 25. Further, the insulating layer 25 is provided between the first wiring layer 21 and the second wiring layer 22, between the first wiring layer 21 and the reflecting layer 50, and between the second wiring layer 22 and the reflecting layer 50. Further, the insulating layer 25 is provided in the periphery of the first metal pillar 23 and in the periphery of the second metal pillar 24, and has contact with the side surface of the first metal pillar 23 and the side surface of the second metal pillar 24. Further, the insulating layer 25 is also provided in the peripheral area of the side surface 15*c* of the semiconductor section 15, and has contact with the reflecting layer 50.

In the embodiment, the first metal pillar 23 is electrically connected to the second surface 15*b* via the first electrode 16. The first metal pillar 23 includes a first metal layer 23 *a* and a third metal layer 23*b*. The first metal layer 23*a* is provided between the second surface 15*b* and at least a part of the third metal layer 23*b*. The first metal layer 23*a* includes, for example, copper (Cu). The hardness of the third metal layer 23*b* is higher than the hardness of the first metal layer 23*a*.

The second metal layer 23*b* includes at least one metal selected from, for example, nickel (Ni) and titanium (Ti). It is also possible to arrange that the third metal layer 23*b* further includes zinc (Zn) in addition to the at least one metal selected from nickel and titanium. The third metal layer 23*b* can be formed of one metal, or an alloy including two or more metals. Further, the hardness can be expressed using, for example, Vickers hardness defined in JIS Z 2244.

The second metal pillar 24 is arranged side by side with the first metal pillar 23 in a second direction intersecting with a first direction from the first surface 15*a* toward the second surface 15*b*. The first direction corresponds to the Z-axis direction. The second metal pillar 24 is electrically connected to the second surface 15*b* via the second wiring layer 17. The second metal pillar 24 includes a second metal layer 24*a* and a fourth metal layer 24*b*. The second metal layer 24*a* is provided between the second surface 15*b* and at least a part of the fourth metal layer 24*b*. The second metal layer 24*a* includes, for example, copper. The hardness of the fourth metal layer 24*b* is higher than the hardness of the second metal layer 24*a*. The fourth metal layer 24*b* includes at least one metal selected from, for example, nickel and titanium. It is also possible to arrange that the fourth metal layer 24*b* further includes zinc.

The first direction is a direction parallel to, for example, the Z-axis direction. One of the directions perpendicular to the Z-axis direction is defined as an X-axis direction. One of the directions perpendicular to the Z-axis direction and the X-axis direction is defined as a Y-axis direction. The second direction is a direction parallel to, for example, the X-axis direction.

In the above description, the pillar (each of the first metal pillar 23 and the second metal pillar 24) has a multilayer structure including, for example, a metal layer including copper, and a metal layer including nickel harder than copper. The metal layer including nickel can be formed by, for example, electrolytic plating.

It is also possible for the pillar to have a multilayer structure including a metal layer including copper, and a metal layer including titanium harder than copper. It is also possible for the pillar to have a multilayer structure including a metal layer including copper, and a metal layer including an alloy of nickel and titanium. Further, it is also possible for the pillar to have a multilayer structure including a metal layer including copper, and a metal layer including an alloy of nickel and zinc. It is also possible for the pillar to have a multilayer structure including a metal layer including copper, and a metal layer including an alloy of titanium and zinc. It is also possible for the pillar to have a multilayer structure including a metal layer including copper, and a metal layer including an alloy of nickel, titanium, and zinc.

In some reference examples, there are provided the first metal pillar and the second metal pillar each having a single layer structure made only of copper. In the manufacturing process, there is executed a grinding process called back side grinding (BSG) in order to expose the edge surfaces of the first metal pillar and the second metal pillar. On this occasion, in the case of relatively soft metal such as copper, it is difficult to perform processing evenly in the grinding process, and in some cases, the shape of the edge surface of the pillar becomes uneven. Therefore, in such cases, the yield ratio is degraded in the manufacturing process. In this reference example, if it is attempted to keep the good shape of the pillar, the time taken in the grinding process is elongated in some cases.

In contrast, in the embodiment, the multilayer structure including, for example, a metal layer including copper, and a metal layer including nickel is applied to the first metal pillar 23. The part to be ground includes nickel. Similarly to the first metal pillar 23, the second metal pillar 24 also has the multilayer structure including a metal layer including copper, and a metal layer including nickel. The hardness of nickel is higher than the hardness of copper. Specifically, the Vickers hardness of nickel is about 638 mega Pascal (MPa), and Vickers hardness of copper is about 369 MPa. Therefore, the unevenness in the shape can be suppressed compared to the single layer structure formed only of a copper layer.

In the embodiment, it is also possible for the part to be ground to include titanium in each of the first metal pillar 23 and the second metal pillar 24. Specifically, the Vickers hardness of titanium is about 970 MPa. In each of the first metal pillar 23 and the second metal pillar 24, it is also possible for the part to be ground to include an alloy including nickel and titanium.

In the embodiment, since the metal pillar has the multi-layer structure including, for example, a metal layer and a metal layer harder than the metal layer, the unevenness in the shape can be suppressed. Therefore, the yield ratio in the manufacturing process can be improved. Further, the window of the condition in the grinding process, for example, is broadened, and the takt time, for example, can be shortened. As described above, in the embodiment, high productivity can be obtained.

It is more preferable to use nickel for the metal pillar. Thus, it is possible to eliminate a nickel plating process in a solder foundation layer forming process described later.

As shown in FIG. IA, the width of the second metal layer 23b in the X-axis direction is roughly the same as the width of at least a part of the first metal layer 23a in the X-axis direction. The width of the third metal layer 23b in the X-axis direction can also be smaller than the width of at least a part of the first metal layer 23a in the X-axis direction. The width of the fourth metal layer 24b in the X-axis direction is roughly the same as the width of at least a part of the second metal layer 24a in the X-axis direction. The width of the fourth metal layer 24b in the X-axis direction can also be smaller than the width of at least a part of the second metal layer 24a in the X-axis direction. For example, it is also possible for each of the first metal pillar 23 and the second metal pillar 24 to be provided with a step-like cross-sectional shape.

The thickness d1 of the first metal layer 23a in the Z-axis direction is larger than the thickness d2 of the third metal layer 23b in the Z-axis direction. The thickness d1 is, for example, not less than 3 micrometers (μm) and not more than 100 μm. The thickness d2 is, for example, not less than 2 μm and not more than 5 μm. The thickness d3 of the second metal layer 24a in the Z-axis direction is larger than the thickness d4 of the fourth metal layer 24b in the Z-axis direction. The thickness d3 is, for example, not less than 3 μm and not more than 100 μm. The thickness d4 is, for example, not less than 2 μm and not more than 5 μm.

The third metal layer 23b includes a first end surface 23c. The first end surface 23c does not overlap the insulating layer 25 in the Z-axis direction. The first end surface 23c is located on an opposite side to the first wiring layer 21. The first end surface 23c is exposed from the insulating layer 25, and functions as an external terminal which can be connected to an external circuit such as a mounting board. The fourth metal layer 24b includes a second end surface 24c. The second end surface 24c does not overlap the insulating layer 25 in the Z-axis direction. The second end surface 24c is located on an opposite side to the second wiring layer 22. The second end surface 24c is exposed from the insulating layer 25, and functions as an external terminal which can be connected to an external circuit such as the mounting board. The first end surface 23c and the second end surface 24c are bonded to a land pattern on the mounting board via, for example, solder or an electrically-conductive bonding material (e.g., gold).

The semiconductor section 15 is formed on the substrate using an epitaxial growth method described later. The substrate is removed after forming the support member 100, and is not provided on the side of the first surface 15a.

As the material of the first metal layer 23a and the second metal layer 24a, there is used, for example, copper. By using copper, good thermal conductivity, high migration resistance, and adhesiveness to the insulating material can be improved.

The insulating layer 25 reinforces the first metal pillar 23 and the second metal pillar 24. It is desirable to use a material, which has a thermal expansion coefficient equal or approximate to that of the mounting board, for the insulating layer 25. As such a material of the insulating layer 25, there can be cited, for example, resin mainly including epoxy resin, resin mainly including silicone resin, and resin mainly including fluorine resin. Further, a light absorbing material can also be included in resin forming a base in the insulating layer 25. For the insulating layer 25, there is used black resin including a pigment component such as carbon black having a light absorbing property with respect to the emission light of the light emitting layer 13. Thus, it is possible to suppress the leakage light from the side surface and the mounting surface side of the support member 100.

Due to the thermal load in mounting the semiconductor light emitting device 110, the stress caused by the solder for bonding the first end surface 23c and the second end surface 24c to the lands on the mounting board is applied to the semiconductor section 15. The first metal pillar 23, the second metal pillar 24, and the insulating layer 25 absorb to relax the stress. In particular, by using the insulating layer 25 more flexible than the semiconductor section 15 as a part of the insulating layer 25, the stress relaxation effect can be enhanced.

The semiconductor light emitting device 110 according to the embodiment is a small-sized semiconductor light emitting device having the chip size package structure. Therefore, in applying the semiconductor light emitting device 110 to, for example, an illumination lamp fitting, the flexibility of lamp fitting design can be enhanced.

Figure 3:
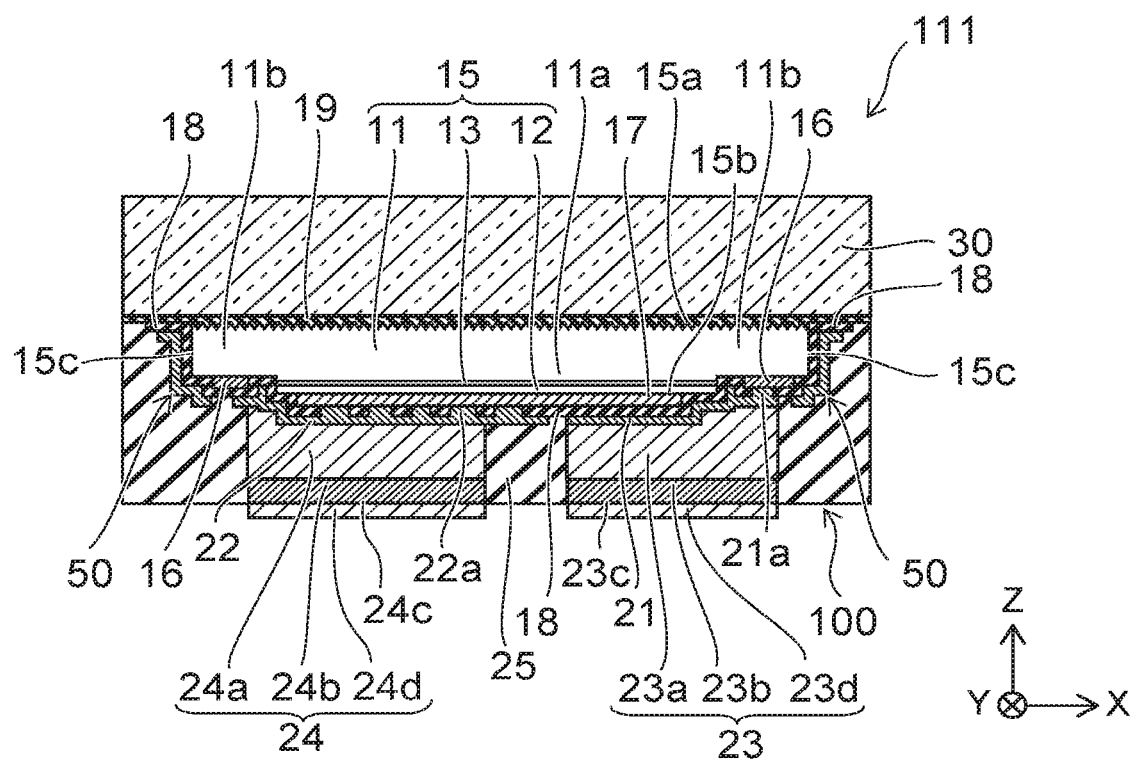
FIG. 3 is a schematic cross-sectional view illustrating another semiconductor light emitting device according to the first embodiment.

FIG. 3 is a schematic cross-sectional view illustrating another semiconductor light emitting device according to the first embodiment.

The semiconductor light emitting device 111 according to the embodiment includes the first metal pillar 23 and the second metal pillar 24. The first metal pillar 23 further includes a fifth metal layer 23d. The fifth metal layer 23d includes gold (Au). The third metal layer 23b is provided between the first metal layer 23a and the fifth metal layer 23d. The second metal pillar 24 further includes a sixth metal layer 24d. The sixth metal layer 24d includes gold. The fourth metal layer 24b is provided between the second metal layer 24a and the sixth metal layer 24d. Specifically, for example, the fifth metal layer 23d including gold is further provided below the third metal layer 23b including nickel. The sixth metal layer 24d including gold is further provided below the fourth metal layer 24b including nickel. The fifth metal layer 23d and the sixth metal layer 24d are each, for example, a gold plated layer. By providing the gold plated layer, the wetting property of the solder can be enhanced. It should be noted that the thickness of each of the fifth metal layer 23d and the sixth metal layer 24d is, for example, not less than 0.01 μm and not more than 0.1 μm In the solder foundation layer forming process, a nickel plated layer and a gold plated layer are provided. The nickel plated layer forms a foundation of the gold plated layer. However, in the metal pillar according to the embodiment, a nickel layer is provided to the pillar. Therefore, in the solder foundation layer forming process, the forming process of the nickel plated layer out of the nickel plated layer and the gold plated layer can be eliminated. It should be noted that as the method of forming the gold plated layer, either of the electrolytic plating and the non-electrolytic plating can be used.

As described above, it is possible to eliminate the forming process of the nickel plated layer in the solder foundation layer forming process to thereby achieve shortening of the solder foundation layer forming process in addition to the fact that the unevenness of the shape can be suppressed due to the multilayer structure of the metal pillar.

FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, and FIG. 11B are processing procedure schematic cross-sectional views illustrating a method of manufacturing the semiconductor light emitting device according to the first embodiment.

Figure 4A:
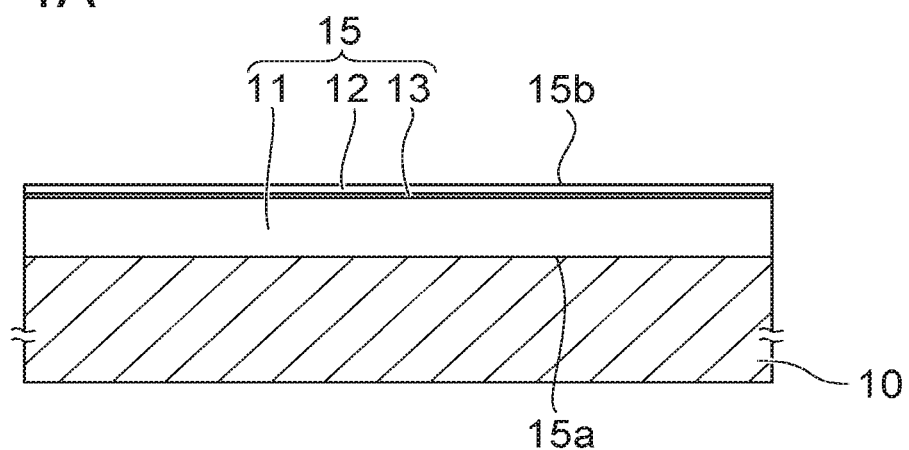
FIG. 4A and FIG. 4B are processing procedure schematic cross-sectional views illustrating a method of manufacturing the semiconductor light emitting device according to the first embodiment.

As shown in FIG. 4A, the semiconductor section 15 is formed on a major surface of the substrate 10. The first semiconductor layer 11, the light emitting layer 13, and the second semiconductor layer 12 are sequentially grown epitaxally on the major surface of the substrate 10 using, for example, a metal organic chemical vapor deposition (MOCVD) method.

In the semiconductor section 15, the surface on the substrate 10 side is the first surface 15a, and the surface on the opposite side to the substrate 10 is the second surface 15b.

As the substrate 10, there is used, for example, a silicon substrate. Alternatively, a sapphire substrate can also be used as the substrate 10. As the semiconductor section 15, there is used, for example, a nitride semiconductor including gallium nitride (GaN).

The first semiconductor layer 11 includes, for example, a buffer layer provided on the major surface of the substrate 10, and an n-type GaN layer provided on the buffer layer. The second semiconductor layer 12 includes, for example, a p-type AlGaN layer provided on the light emitting layer 13, and a p-type GaN layer provided on the p-type AlGaN layer. The light emitting layer 13 has, for example, a multiple quantum well (MQW) structure.

Figure 4B:
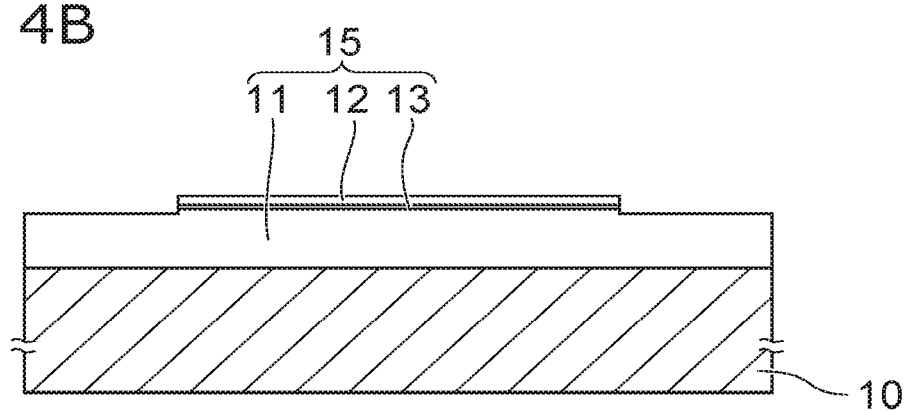

As shown in FIG. 4B, the second semiconductor layer 12 and the light emitting layer 13 are selectively removed. The second semiconductor layer 12 and the light emitting layer 13 are selectively etched using, for example, a reactive ion etching (RIE) method to expose the first semiconductor layer 11.

Figure 5A:
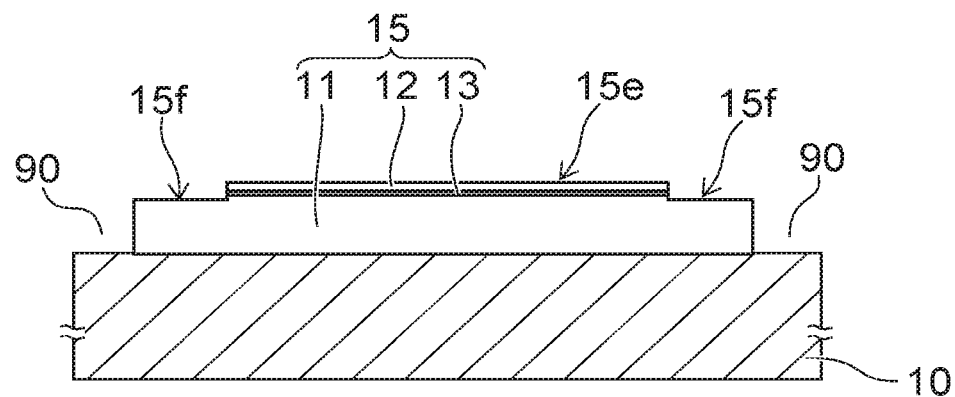
FIG. 5A and FIG. 5B are processing procedure schematic cross-sectional views illustrating a method of manufacturing the semiconductor light emitting device according to the first embodiment.

As shown in FIG. 5A, the first semiconductor layer 11 is selectively removed to form grooves 90. On the major surface of the substrate 10, the semiconductor section 15 is separated by the grooves 90 into a plurality of parts. The grooves 90 penetrate the semiconductor section 15 to reach the substrate 10. Depending on the etching condition, the major surface of the substrate 10 is also etched slightly, and the bottom surfaces of the grooves 90 recedes downward from the interface between the substrate 10 and the semiconductor section 15 in some cases. It should be noted that it is also possible for the grooves 90 to be formed after forming the first electrode 16 and the second electrode 17.

Figure 5B:
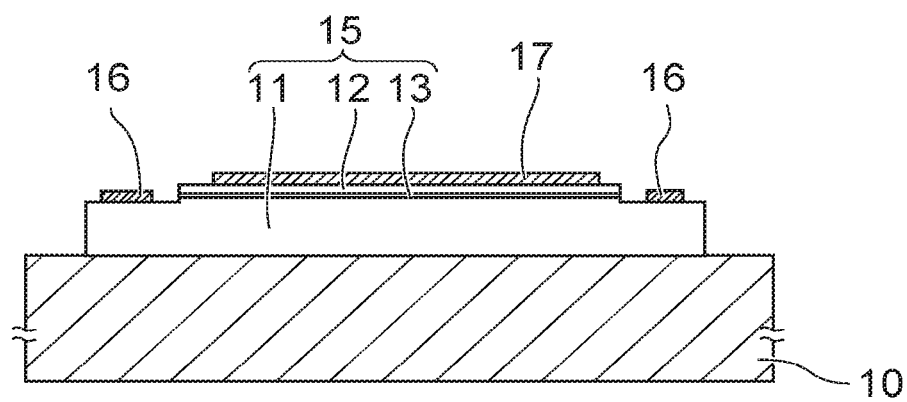

As shown in FIG. 5B, the second electrode 17 (the p-electrode) is formed on the surface of the second semiconductor layer 12. Further, the first electrode 16 (the n-electrode) is formed on the surface of the first semiconductor layer 11 in the region where the second semiconductor layer 12 and the light emitting layer 13 are selectively removed.

The first electrode 16 and the second electrode 17 are formed using, for example, a sputtering method, an evaporation method, or the like. Either of the first electrode 16 and the second electrode 17 can be formed first, or it is also possible to form the first electrode 16 and the second electrode 17 with the same material at the same time.

The second electrode 17, which is to be formed in the region where the light emitting layer 13 is stacked, includes a reflecting film for reflecting the light radiated from the light emitting layer 13. For example, the second electrode 17 includes at least either one of silver, a silver alloy, aluminum, and an aluminum alloy. Further, in order to prevent sulfurization and oxidization of the reflecting film, it is also possible for the second electrode 17 to include a metal protective film (barrier metal).

Figure 6A:
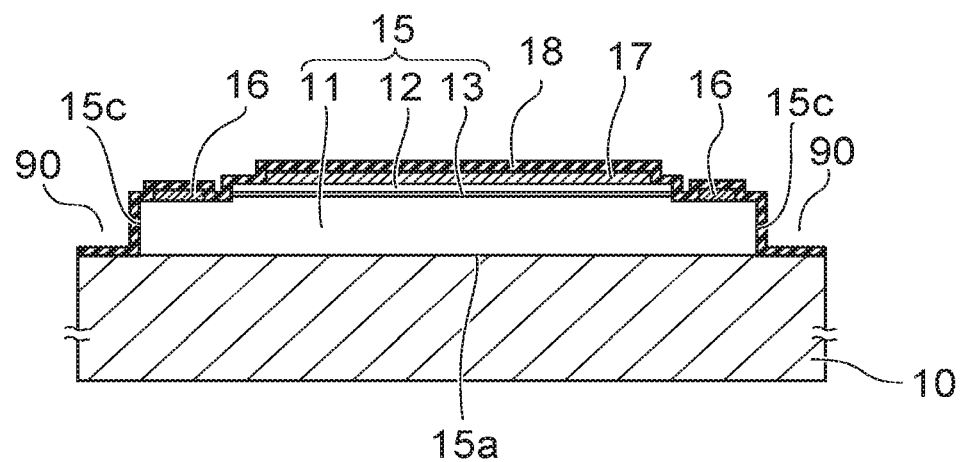
FIG. 6A and FIG. 6B are processing procedure schematic cross-sectional views illustrating a method of manufacturing the semiconductor light emitting device according to the first embodiment.

As shown in FIG. 6A, the interlayer insulating layer 18 is formed on the semiconductor section 15 provided on the substrate 10. The interlayer insulating layer 18 protects the first electrode 16 and the second electrode 17. Further, the interlayer insulating layer 18 protects the side surface 15c continuous with the first surface 15a of the semiconductor section 15. Further, the interlayer insulating layer 18 is also formed on the surface of the substrate in the bottom surfaces of the grooves 90. As the interlayer insulating layer 18, there can be used a silicon oxide film or a silicon nitride film formed using, for example, a chemical vapor deposition (CVD) method.

Figure 6B:
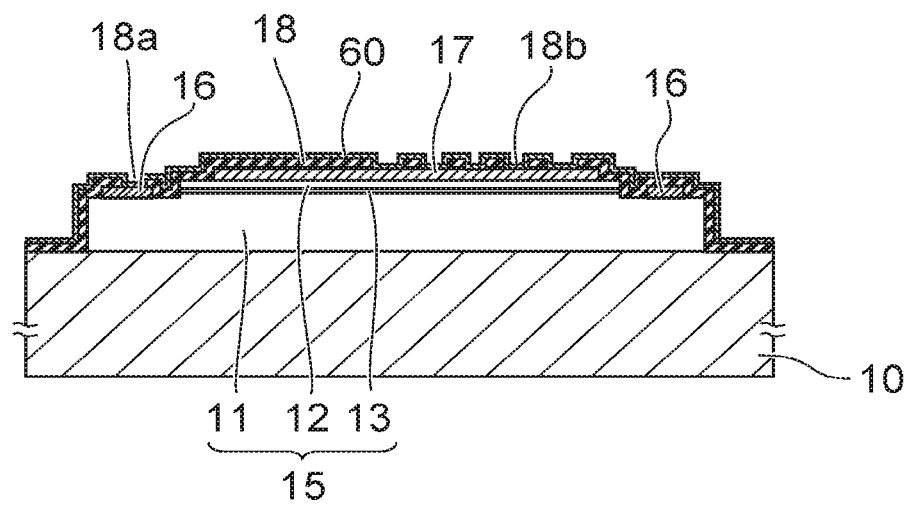

As shown in FIG. 6B, the interlayer insulating layer 18 is provided with a first opening 18a and a second opening 18b by, for example, a wet etching process using a resist mask. The first opening 18a reaches the first electrode 16, and the second opening 18b reaches the second electrode 17.

As shown in FIG. 6B, the surface of the interlayer insulating layer, inside walls (a side wall and a bottom surface) of the first opening 18a, inside walls (a side wall and a bottom surface) of the second opening 18b are provided with a foundation metal layer 60. The foundation metal layer 60 includes, for example, an aluminum film, a titanium film, and a copper film. The foundation metal layer 60 is formed using, for example, a sputtering method.

Figure 7A:
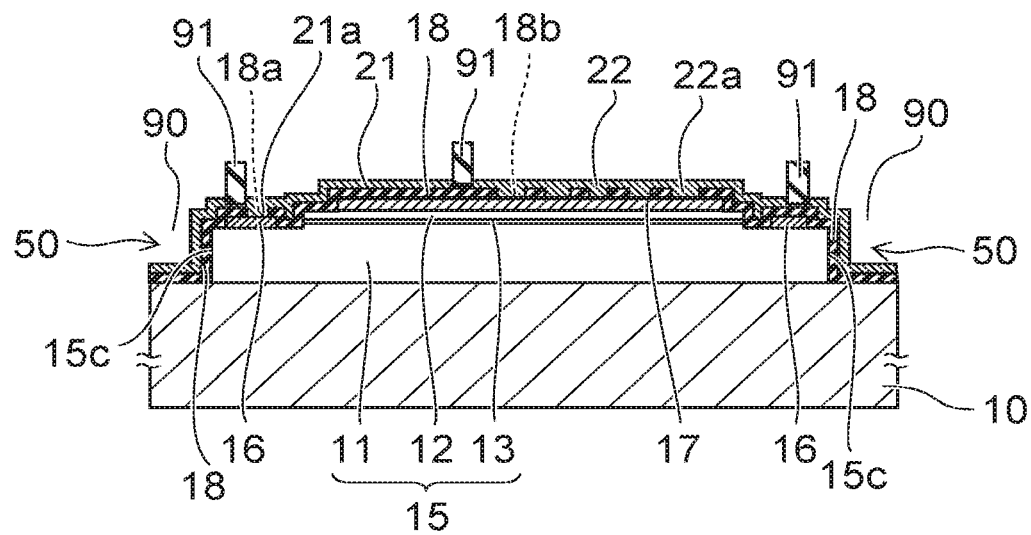
FIG. 7A and FIG. 7B are processing procedure schematic cross-sectional views illustrating a method of manufacturing the semiconductor light emitting device according to the first embodiment.

As shown in FIG. 7A, a resist mask 91 is selectively formed on the foundation metal layer 60, and then the first wiring layer 21, the second wiring layer 22, and the reflecting layer 50 are formed by an electrolytic copper plating method using the copper film of the foundation metal layer 60 as a seed layer.

Figure 7B:
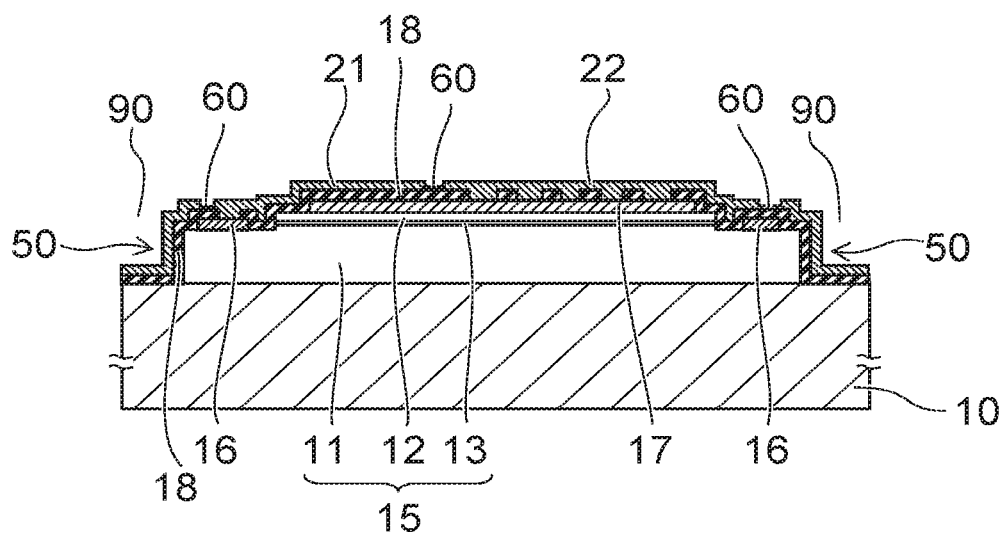

The first wiring layer 21 is also formed inside the first opening 18a, and is electrically connected to the first electrode 16. The second wiring layer 22 is also formed inside the second opening 18b, and is electrically connected to the second electrode 17. The resist mask 91 is removed as shown in FIG. 7B using, for example, a solvent or oxygen plasma.

Figure 8A:
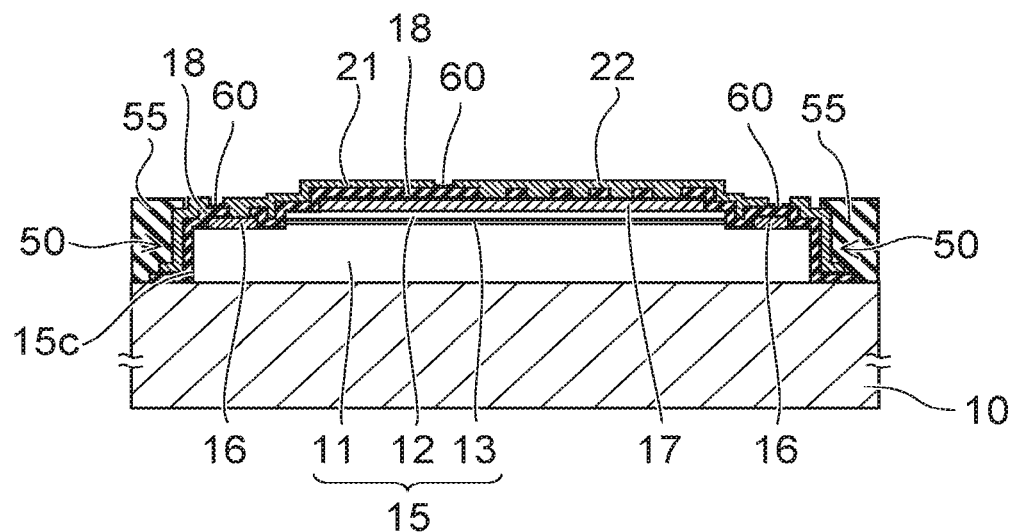
FIG. 8A and FIG. 8B are processing procedure schematic cross-sectional views illustrating a method of manufacturing the semiconductor light emitting device according to the first embodiment.

As shown in FIG. 8A, a resin layer is formed on the entire surface of the first wiring layer 21, the second wiring layer 22, and the reflecting layer 50, and then the resin layer on the reflecting layer 50 is left as a mask layer 55. The mask layer 55 is, for example, a photosensitive polyimide resin, and is left on the reflecting layer 50 using selective exposure with respect to the resin layer formed on the entire surface and the development after the exposure. The mask layer 55 covers the reflecting layer, and is left in the peripheral area of the side surface 15c of the semiconductor section 15.

By forming the mask layer 55 in the stage, in which the first metal pillar 23 and the second pillar 24 have not been formed, and therefore the unevenness (steps) is small, it becomes easy to perform the lithography process on the mask layer 55.

Figure 8B:
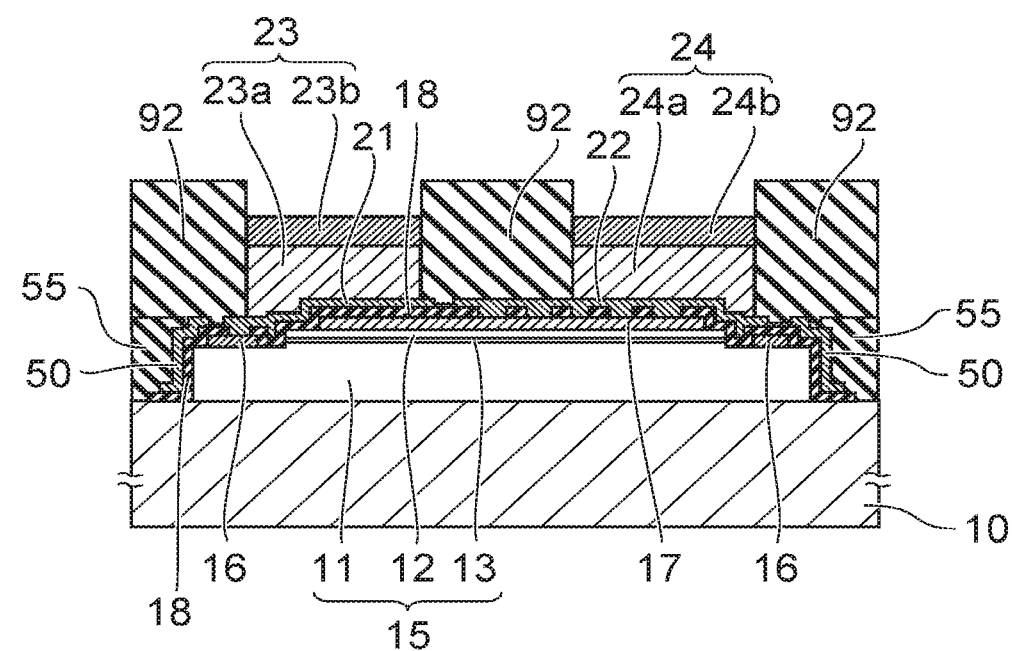

As shown in FIG. 8B, a resist mask 92 is selectively formed on the structure shown in FIG. 8A, and then, the first metal pillar 23 and the second pillar 24 are formed by an electrolytic copper plating method using the first wiring layer 21 and the second wiring layer 22 as the seed layer. In this example, the first metal pillar 23 has a multilayer structure including the first metal layer 23*a* including copper, and the third metal layer 23*b* including nickel. The second metal pillar 24 has a multilayer structure including the second metal layer 24*a* including copper, and the fourth metal layer 24*b* including nickel.

The first metal layer 23*a* is formed on the first wiring layer 21. The first wiring layer 21 and the first metal layer 23*a* are integrated with each other using the same copper material. The third metal layer 23*b* is formed on the first metal layer 23*a*. The second metal layer 24*a* is formed on the second wiring layer 22. The second wiring layer 22 and the third metal layer 24*a* are integrated with each other using the same copper material. The fourth metal layer 24*b* is formed on the second metal layer 24*a*. It should be noted that the reflecting layer 50 and the mask layer 55 are covered with the resist mask 92, and no metal pillar is provided on the reflecting layer 50 and the mask layer 55.

Figure 9A:
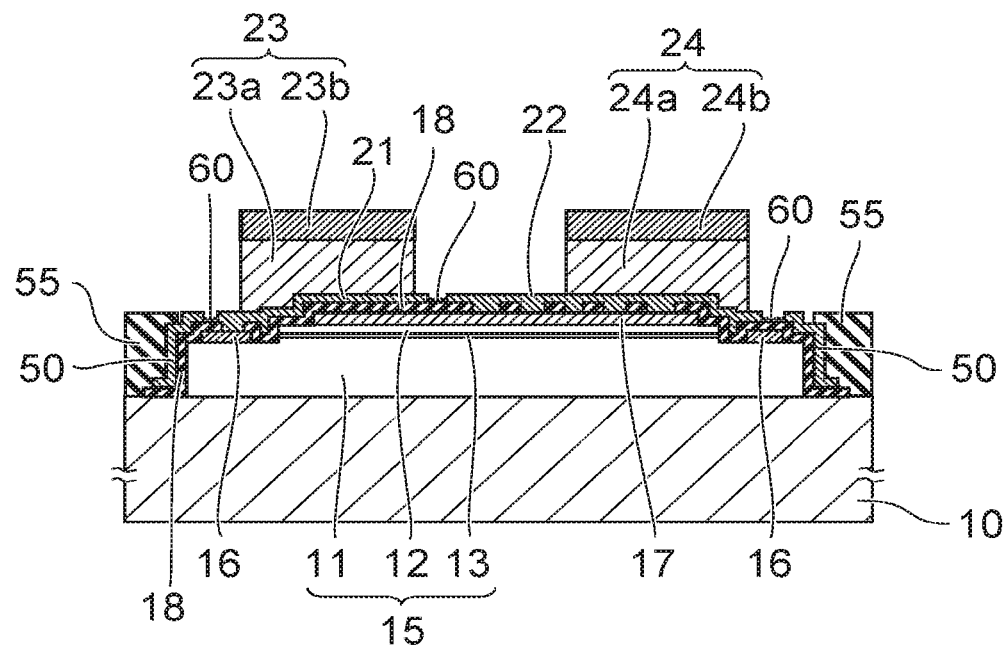
FIG. 9A and FIG. 9B are processing procedure schematic cross-sectional views illustrating a method of manufacturing the semiconductor light emitting device according to the first embodiment.

As shown in FIG. 9A, the resist mask 92 shown in FIG. 8B is removed using, for example, a solvent or oxygen plasma.

At this point, the first wiring layer 21 and the second wiring layer 22 are connected via the foundation metal layer 60. Further, the first wiring layer 21 and the reflecting layer 50 are also connected via the foundation metal layer 60, and the second wiring layer 22 and the reflecting layer 50 are also connected via the foundation metal layer 60.

Figure 9B:
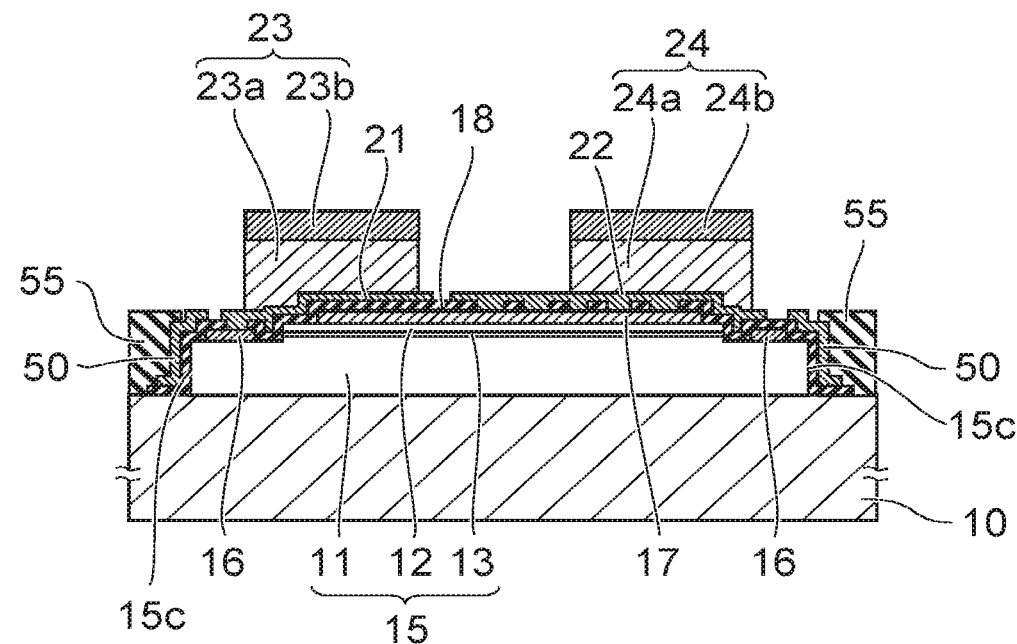

Therefore, as shown in FIG. 9B, the foundation metal layer 60 is removed by etching. Thus, the electrical connection between the first wiring layer 21 and the second wiring layer 22, the electrical connection between the first wiring layer 21 and the reflecting layer 50, and the electrical connection between the second wiring layer 22 and the reflecting layer 50 are each separated.

Figure 10A:
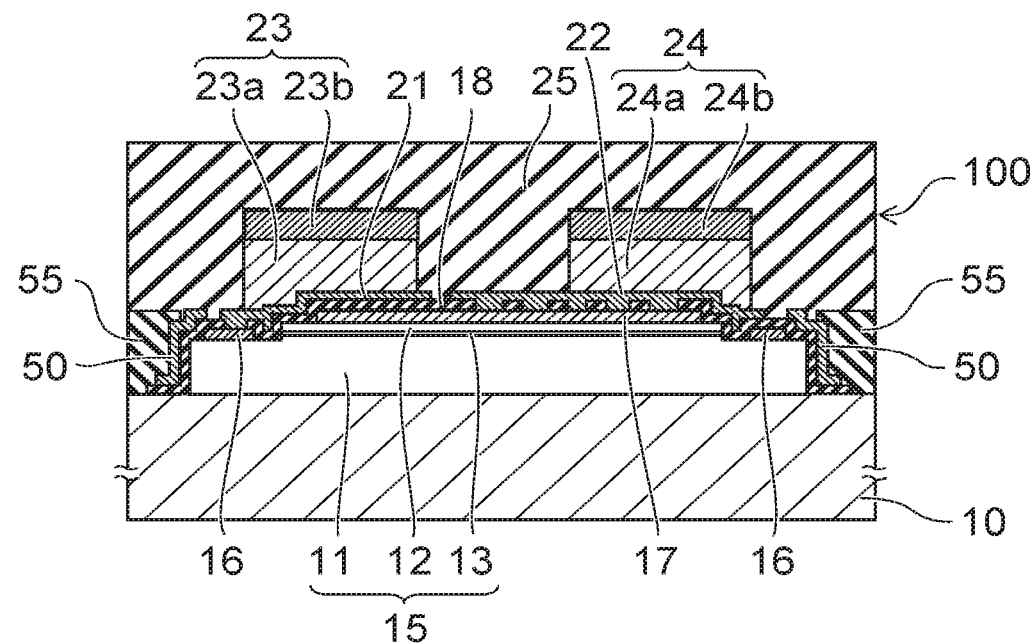
FIG. 10A and FIG. 10B are processing procedure schematic cross-sectional views illustrating a method of manufacturing the semiconductor light emitting device according to the first embodiment.

As shown in FIG. 10A, the semiconductor layer 25 is formed on the structure shown in FIG. 9B. The insulating layer 25 is formed on the first wiring layer 21, the first metal pillar 23, the second wiring layer 22, and the second metal pillar 24. The insulating layer 25 is also formed on the mask layer 55 provided on the reflecting layer 50.

The insulating layer 25 constitutes the support member 100 together with the first wiring layer 21, the first metal pillar 23, the second wiring layer 22, and the second metal pillar 24. The substrate 10 is removed in the state in which the semiconductor section 15 is supported by the support member 100.

For example, the substrate 10 as the silicon substrate is removed by wet etching. In the case in which the substrate 10 is a sapphire substrate, the substrate 10 can be removed by a laser lift-off method.

The semiconductor section 15 epitaxially grown on the substrate 10 includes strong internal stress in some cases. Further, the first metal pillar 23, the second metal pillar 24, and the insulating layer 25 are made of materials more flexible compared to, for example, a GaN series material of the semiconductor section 15. Therefore, even if the internal stress generated in the epitaxial growth is released at once when exfoliating the substrate 10, the first metal pillar 23, the second metal pillar 24, and the insulating layer 25 absorb the stress. Therefore, it is possible to avoid the breakage of the semiconductor section 15 in the process of removing the substrate 10.

Figure 10B:
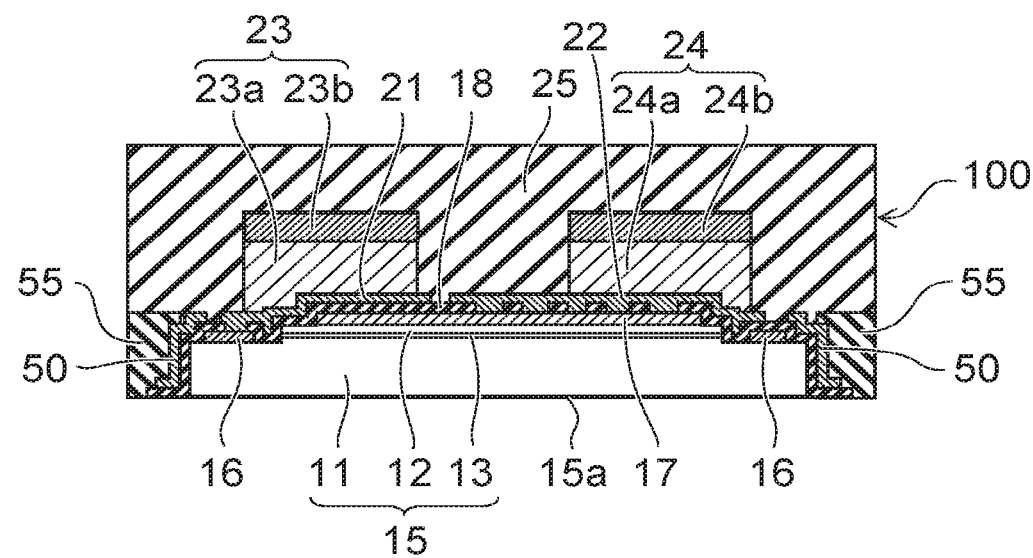

As shown in FIG. 10B, the first surface 15*a* of the semiconductor section 15 is exposed due to the removal of the substrate 10. The first surface 15*a* thus exposed is provided with a fine concavo-convex pattern. The first surface 15*a* is etched using a wet etching process with, for example, a KOH (potassium hydroxide) solution or tetramethylammonium hydroxide (TMAH). In this etching process, there occurs a difference in etching rate depending on the crystal plane orientation. Therefore, the concavo-convex pattern can be provided to the first surface 15*a*. By providing the concave-convex pattern to the first surface 15*a*, the extraction efficiency of the light radiated from the light emitting layer 13 can be improved.

Figure 11A:
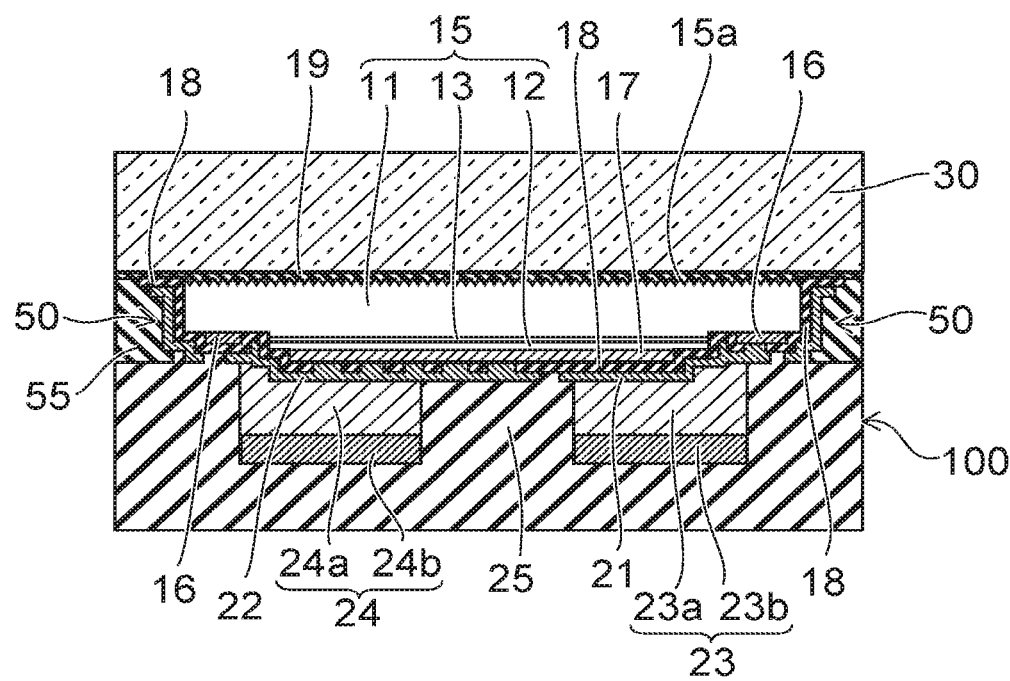
FIG. 11A and FIG. 11B are processing procedure schematic cross-sectional views illustrating a method of manufacturing the semiconductor light emitting device according to the first embodiment.

As shown in FIG. 11A, the phosphor layer 30 is formed on the first surface 15*a* via the interlayer insulating layer 19.

The phosphor layer 30 is formed using a method such as printing, potting, molding, or compression molding. The interlayer insulating layer 19 enhances the adhesiveness between the semiconductor section 15 and the phosphor layer 30.

As the phosphor layer 30, it is possible to bond a sintered phosphor, which has been obtained by sintering the phosphor particles via the bonding material, to the phosphor layer 30 via the interlayer insulating layer 30.

The phosphor layer 30 is also formed on the peripheral area of the side surface 15*c* of the semiconductor section 15.

In the peripheral area of the side surface 15*c* of the semiconductor section 15, there is left the mask layer 55. On the mask layer 55, there is formed the phosphor layer 30 via the reflecting layer 50, the interlayer insulating layer 18, and the interlayer insulating layer 19.

Figure 11B:
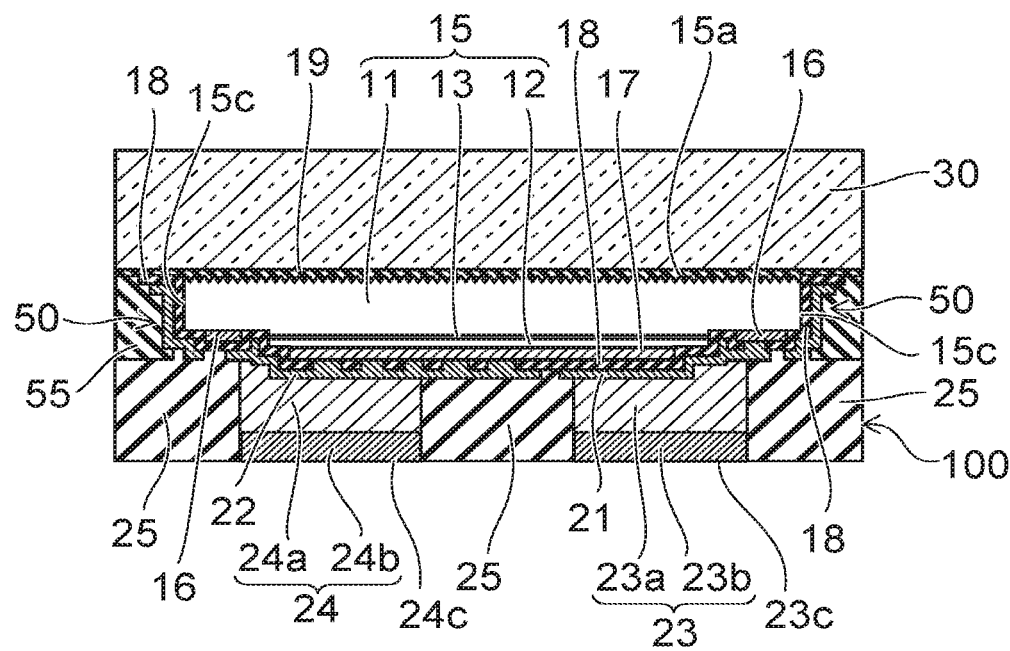

As shown in FIG. 11B, after forming the phosphor layer 30, the surface of the insulating layer 25 is ground to expose the first metal pillar 23 and the second metal pillar 24 from the insulating layer 25. In other words, the first end surface 23*c* of the first metal pillar 23 is exposed, and the second end surface 24*c* of the second metal pillar 24 is exposed.

The first end surface 23*c* to be the surface to be ground is made of nickel. The second end surface 24*c* to be the surface to be ground is made of nickel. As described above, nickel is harder than copper. Therefore, it is possible to inhibit the shape from becoming uneven in the grinding process.

Subsequently, in the areas provided with the grooves 90 for separating the plurality of semiconductor layers 15 from each other, the structures each shown in FIG. 11B are separated from each other. In other words, the phosphor layer 30, the interlayer insulating layer 19, the interlayer insulating layer 18, the reflecting layer 50, the mask layer 55, and the insulating layer 25 are cut. These layers are cut using, for example, a dicing blade or a laser beam. The semiconductor layers 15 do not exist in the dicing areas, and are therefore not damaged by the singulation process.

Each of the processes described above, which are performed before the singulation process is performed, is performed on the wafer including a plurality of semiconductor layers 15. From the wafer, semiconductor light emitting devices 110 each including at least one semiconductor section 15 are singulated. It should be noted that it is also possible for the semiconductor light emitting device 110 to have the single chip structure including one semiconductor section 15, or to have a multi-chip structure including two or more semiconductor layers 15.

Since each of the processes described above, which are performed before the singulation process is performed, is performed in a lump on the wafer, it is not required to perform the formation of the wiring layer, formation of the pillars, packaging with the resin layer, and formation of the phosphor layer for the individual devices obtained by the singulation process, and dramatic cost reduction becomes possible.

Since the support member 100 and the phosphor layer 30 are formed in the wafer state, and are then cut, the side surface of the phosphor layer 30 and the side surface (the side surface of the mask layer 55, the side surface of the insulating layer 25) of the support member 100 are aligned with each other, and form the side surface of the semiconductor light emitting device 110 obtained by the singulation process. Therefore, in cooperation with the absence of the substrate 10, a small-sized semiconductor light emitting device 110 having the chip size package structure can be provided.

(Second Embodiment)

Figure 12:
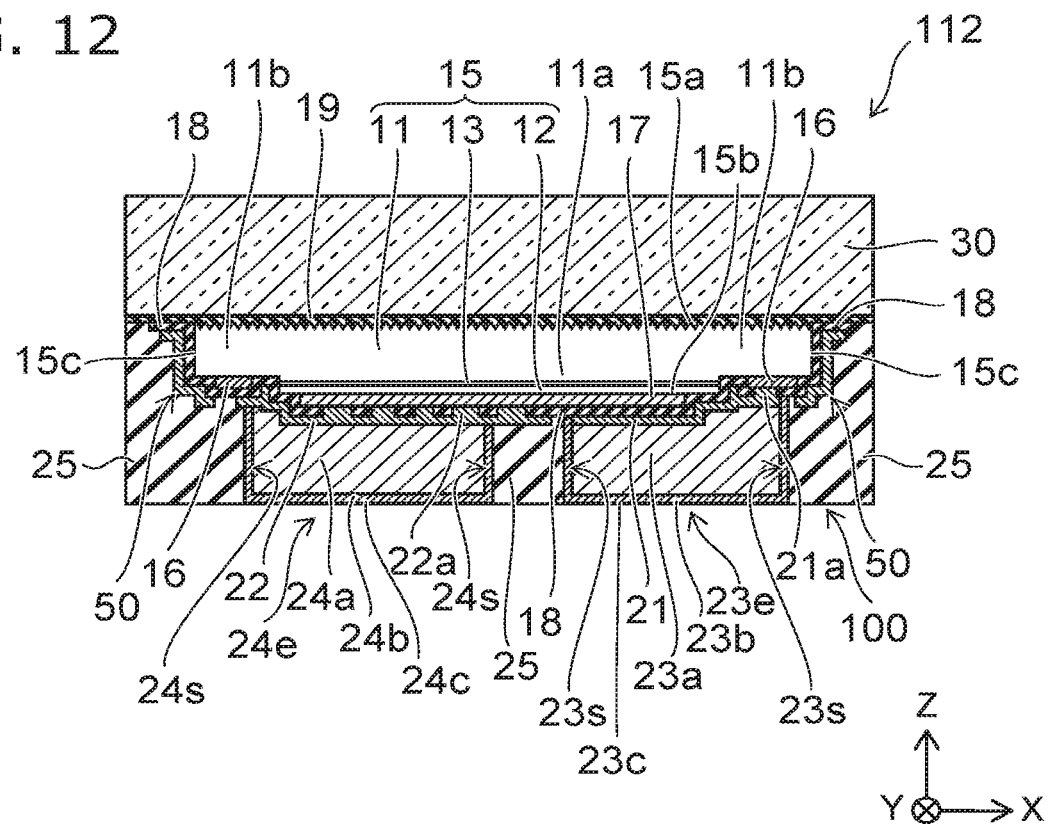
FIG. 12 is a schematic cross-sectional view illustrating a semiconductor light emitting device according to a second embodiment.

FIG. 12 is a schematic cross-sectional view illustrating a semiconductor light emitting device according to a second embodiment.

The semiconductor light emitting device 112 according to the embodiment includes a first metal pillar 23e and a second metal pillar 24e. The first metal pillar 23e has a multilayer structure including, for example, the first metal layer 23a including copper, and the third metal layer 23b including nickel. The second metal pillar 24e has a multilayer structure including, for example, the second metal layer 24a including copper, and the fourth metal layer 24b including nickel.

In the embodiment, the first metal layer 23a includes a first side surface 23s parallel to the Z-axis direction. The third metal layer 23b is provided between the first side surface 23s and the insulating layer 25. The second metal layer 24a includes a second side surface 24s parallel to the Z-axis direction. The fourth metal layer 24b is provided between the second side surface 24s and the insulating layer 25. In other words, the metal layer including nickel is provided not only on the upper surface of the metal layer including copper, but also along the side surface of the metal layer including copper. Since the metal layer including nickel intervenes there between, the metal layer including copper does not have contact with the insulating layer 25. The metal layer including nickel can be formed using, for example, non-electrolytic plating. The thickness of each of the metal layers (the third metal layer 23b and the fourth metal layer 24b) including nickel is, for example, not less than 0.01 μm and not more than 20 μm.

It is preferable for the second metal layer 23b to include at least one metal selected from nickel and titanium. It is also possible to arrange that the third metal layer 23b further includes zinc. It is preferable for the fourth metal layer 24b to include at least one metal selected from nickel and titanium. It is also possible to arrange that the fourth metal layer 24b further includes zinc.

In the first embodiment, the insulating layer 25 and the first side surface 23s of the first metal layer 23a have contact with each other, and the insulating layer 25 and the second side surface 24s of the second metal layer 24a have contact with each other. The first metal layer 23a and the third metal layer 24a are both made of copper. Since the insulating layer 25 is made of resin, there occurs copper-induced degradation, namely the oxidation caused by copper, in some cases. Due to the copper-induced degradation, the insulating layer 25 is deteriorated.

Due to the catalytic action (redox reaction) of a metal ion facilitating the oxidation reaction of resin, the resin is deteriorated. Copper particularly tends to easily affect the resin. Copper causes the degradation promotion called copper-induced degradation described above. The rate of the influence for each element the metal has on the plastic is as follows. According to the influence rate, cobalt (Co) the most easily deteriorates the resin, and magnesium (Mg) the least easily deteriorates the resin.

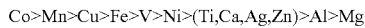

Co>Mn>Cu>Fe>V>Ni>(Ti,Ca,Ag,Zn)>Al>Mg

The metal ion ($M^{n+}/M^{(n+1)+}$) catalytically cracks hydroperoxide (ROOH) into free radicals (RO·, ROO·) using the redox reaction to facilitate the chain reaction.

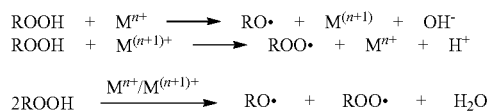

Chemical Formula 1

$$ROOH + M^{n+} \longrightarrow RO\cdot + M^{(n+1)} + OH^-$$
$$ROOH + M^{(n+1)+} \longrightarrow ROO\cdot + M^{n+} + H^+$$
$$2ROOH \xrightarrow{M^{n+}/M^{(n+1)+}} RO\cdot + ROO\cdot + H_2O$$

In the initial stage of the deterioration, the polymer (RH) and the metal ion ($M^{n+}$) become to directly react with each other to generate the free radicals (R·).

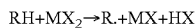

$$RH + MX_2 \rightarrow R\cdot + MX + HX$$

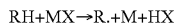

$$RH + MX \rightarrow R\cdot + M + HX$$

Chemical Formula 2

Nickel, titanium, and zinc are low in the influence rate on the insulating layer 25 compared to copper. In the embodiment, the third metal layer 23b (e.g., a nickel layer) is provided between the first side surface 23s of the first metal layer 23a (a copper layer) and the insulating layer 25. The fourth metal layer 24b (e.g., a nickel layer) is provided between the second side surface 24s of the second metal layer 24a (a copper layer) and the insulating layer 25. Thus, the first metal layer 23a (the copper layer) does not have contact with the insulating layer 25, and the second metal layer 24a (the copper layer) also does not have contact with the insulating layer 25. Therefore, due to the multilayer structure of each of the first metal pillar 23 and the second metal pillar 24, it is possible to suppress the unevenness of the shape, and at the same time inhibit the copper-induced degradation in the insulating layer 25 from occurring.

Figure 13:
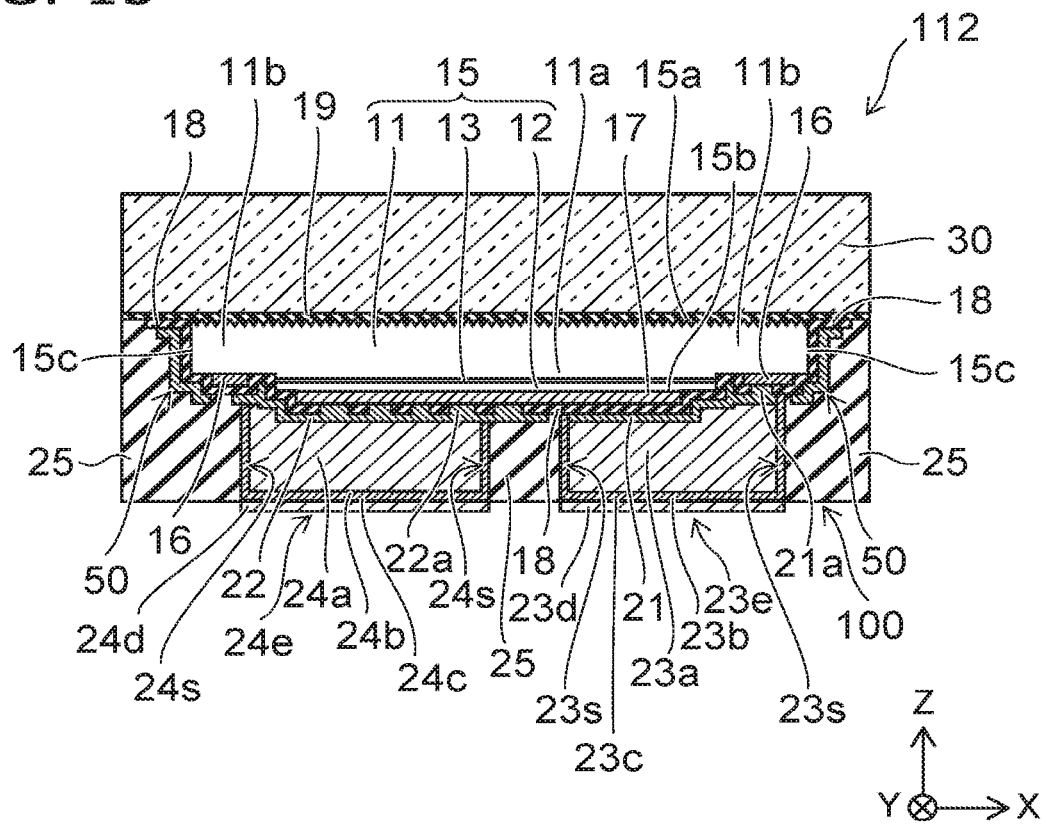
FIG. 13 is a schematic cross-sectional view illustrating another semiconductor light emitting device according to the second embodiment.

FIG. 13 is a schematic cross-sectional view illustrating another semiconductor light emitting device according to the second embodiment.

The semiconductor light emitting device 113 according to the embodiment includes a first metal pillar 23e and a second metal pillar 24e. The first metal pillar 23e further includes the fifth metal layer 23d. The fifth metal layer 23d includes gold. The third metal layer 23b is provided between the first metal layer 23a and the fifth metal layer 23d. The second metal pillar 24e further includes the sixth metal layer 24d. The sixth metal layer 24d includes gold. The fourth metal layer 24b is provided between the second metal layer 24a and the sixth metal layer 24d.

Specifically, for example, the fifth metal layer 23d including gold is provided below the third metal layer 23b including nickel. The sixth metal layer 24d including gold is further provided below the fourth metal layer 24b including nickel. The fifth metal layer 23d and the sixth metal layer 24d are each, for example, a gold plated layer. By providing the gold plated layer, the wetting property of the solder can be enhanced. The thickness of each of the fifth metal layer 23d and the sixth metal layer 24d is, for example, not less than 0.01 μm and not more than 0.1 μm.

As described above, in the solder foundation layer forming process, a nickel plated layer and a gold plated layer are provided. The nickel plated layer forms a foundation of the gold plated layer. The metal pillar according to the embodiment includes the nickel layer. Therefore, in the solder foundation layer forming process, the forming process of the nickel plated layer out of the nickel plated layer and the gold plated layer can be eliminated. It should be noted that as the method of forming the gold plated layer, either of the electrolytic plating and the non-electrolytic plating can be used.

(Third Embodiment)

Figure 14:
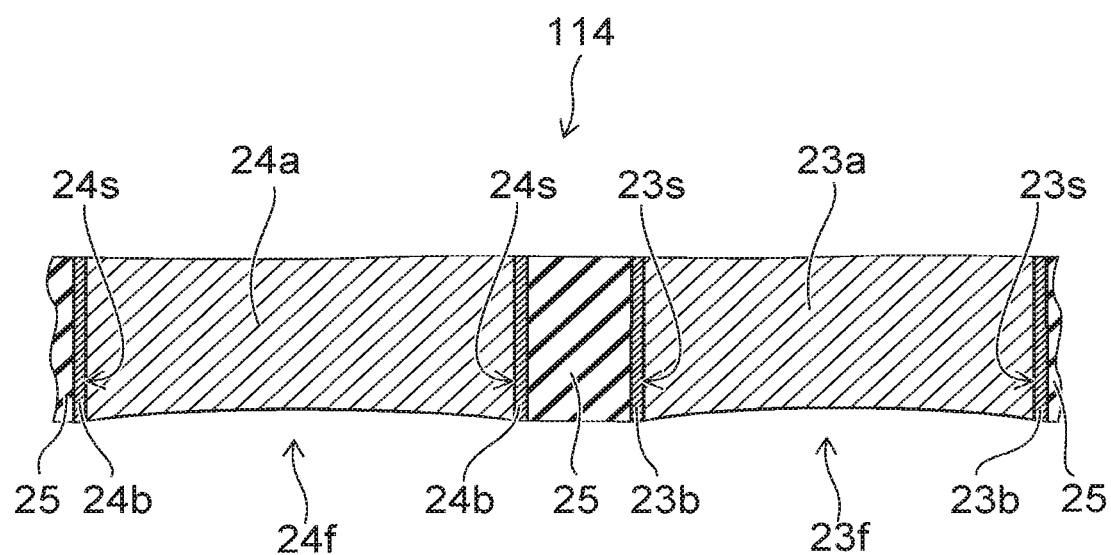
FIG. 14 is a schematic cross-sectional view illustrating a part of a semiconductor light emitting device according to a third embodiment.

FIG. 14 is a schematic cross-sectional view illustrating a part of a semiconductor light emitting device according to a third embodiment.

The semiconductor light emitting device 114 according to the embodiment includes a first metal pillar 23f and a second metal pillar 24f. The first metal pillar 23f includes the first metal layer 23a and the second metal layer 23b. The third metal layer 23b is provided so as to be opposed to the first side surface 23s of the first metal layer 23a. The third metal layer 23b is not provided on the lower surface of the first metal layer 23a. The second metal pillar 24f includes the third metal layer 24a and the fourth metal layer 24b. The fourth metal layer 24b is provided so as to be opposed to the second side surface 24s of the second metal layer 24a. The fourth metal layer 24b is not provided on the lower surface of the second metal layer 24a.

The insulating layer 25 is provided between the third metal layer 23b and the fourth metal layer 24b. In other words, the second metal layer 23b is provided between the first side surface 23s and the insulating layer 25. The fourth metal layer 24b is provided between the second side surface 24s and the insulating layer 25. The metal layers (the third metal layer 23b, the fourth metal layer 24b) including nickel is only provided on the sides surface of the metal layers (the first metal layer 23a, the second metal layer 24a) including copper. Therefore, the metal layers including copper do not have contact with the insulating layer 25.

As described above, it is also possible to arrange that the metal layer including nickel are provided only between the side surfaces (the peripheral surfaces) of the metal layers including copper and the insulating layer. Thus, it is possible to suppress the unevenness of the shape in the metal pillar, and at the same time inhibit the copper-induced degradation in the insulating layer from occurring. Further, the oxidation of the metal pillar itself can also be inhibited.

According to the embodiment, the semiconductor light emitting device high in productivity can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as semiconductor sections, first metal pillars, second metal pillars, and insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:

forming a semiconductor member on a substrate, the semiconductor member including a first semiconductor layer having a first conductivity type, a light emitting layer, and a second semiconductor layer having a second conductivity type, the second semiconductor layer and a part of the first semiconductor layer being exposed on an upper surface of the semiconductor member;

forming a first metal layer on the part of the first semiconductor layer and forming a second metal layer on the second semiconductor layer, the first metal layer being connected to the part of the first semiconductor layer, and the second metal layer being connected to the second semiconductor layer;

forming a third metal layer on the first metal layer and forming a fourth metal layer on the second metal layer, the third metal layer being connected to the first metal layer, and the fourth metal layer being connected to the second metal layer;

forming a first insulating layer covering a first pillar and a second pillar, the first pillar including the first metal layer and the third metal layer, and the second pillar including the second metal layer and the fourth metal layer;

exposing a first surface of the semiconductor member by removing the substrate; and exposing the third metal layer and the fourth metal layer by grinding the first insulating layer wherein after the exposing the third metal layer and the fourth metal layer, a thickness of the third metal layer along a first direction from the first metal layer to the third metal layer is smaller than a thickness of the first metal layer along the first direction.

2. The method according to claim 1, wherein a hardness of the third metal layer is higher than a hardness of the first metal layer, and a hardness of the fourth metal layer is higher than a hardness of the second metal layer.

3. The method according to claim 1, wherein the first metal layer and the second metal layer include copper.

4. The method according to claim 3, wherein the third metal layer and the fourth metal layer include nickel.

5. The method according to claim 4, wherein the third metal layer and the fourth metal layer further include zinc.

6. The method according to claim 3, wherein
the third metal layer and the fourth metal layer include titanium.

7. The method according to claim 6, wherein
the third metal layer and the fourth metal layer further include zinc.

8. The method according to claim 3, wherein
the third metal layer and the fourth metal layer include titanium and nickel.

9. The method according to claim 8, wherein
the third metal layer and the fourth metal layer further include zinc.

10. The method according to claim 1, further comprising:
forming a phosphor layer on the first surface of the semiconductor member.

11. The method according to claim 1, further comprising:
forming a concavo-convex pattern on the first surface of the semiconductor member.

12. The method according to claim 1, further comprising:
forming a first electrode on the part of the first semiconductor layer and forming a second electrode on the second semiconductor layer, the first electrode being connected to the part of the first semiconductor layer, and the second electrode being connected to the second semiconductor layer;
forming a second insulating layer with a first opening and a second opening, the second insulating layer covering the semiconductor member, the first electrode, and the second electrode, the first opening reaching the first electrode, and the second opening reaching the second electrode; and
forming a first wiring layer and a second wiring layer on the second insulating layer, the first wiring layer being connected to the first electrode via the first opening, and the second wiring layer being connected to the second electrode via the second opening, wherein
in the forming the first metal layer and the second metal layer, the first metal layer is connected to the first wiring layer, and the second metal layer is connected to the second wiring layer.

13. The method according to claim 12, wherein
the first electrode includes at least one selected from the group consisting of silver, a silver alloy, aluminum, and an aluminum alloy.

14. The method according to claim 12, wherein
the second electrode includes at least one selected from the group consisting of silver, a silver alloy, aluminum, and an aluminum alloy.

15. The method according to claim 12, further comprising
forming a third insulating layer on a side surface of a reflecting layer, wherein
the reflecting layer is formed on a side surface of the semiconductor member in the forming the first wiring layer and the second wiring layer, and
the first insulating layer covers the third insulating layer.

16. The method according to claim 12, wherein
the forming the first wiring layer and the second wiring layer includes:
forming a foundation metal layer on the second insulating layer, on an inner surface of the first opening, and on an inner surface of the second opening;
selectively forming a resist mask on the foundation metal layer;
electrolytic plating copper using the foundation metal layer as a seed layer; and
removing the resist mask,
the method further comprising
removing a portion of the foundation metal layer, the portion not being covered with the first pillar or the second pillar.

17. The method according to claim 16, wherein
the forming the foundation metal layer includes depositing copper by using a sputtering method.

18. The method according to claim 12, further comprising:
selectively forming a resist mask on the first wiring layer and the second wiring layer, after the forming the first wiring layer and the second wiring layer, and before the forming the first metal layer and the second metal layer; and
removing the resist mask, after the forming the third metal layer and the fourth metal layer, and before the forming the first insulating layer, wherein
the forming the first metal layer and the second metal layer includes electrolytic plating a first metal using the first wiring layer and the second wiring layer as seed layers, and
the forming the third metal layer and the fourth metal layer includes electrolytic plating a second metal.

* * * * *